United States Patent
Wight et al.

(10) Patent No.: US 6,937,096 B2
(45) Date of Patent: Aug. 30, 2005

(54) SWITCHED-MODE POWER AMPLIFIER INTEGRALLY PERFORMING POWER COMBINING

(75) Inventors: James Stuart Wight, Ottawa (CA); Johan M. Grundlingh, Kinburn (CA)

(73) Assignee: Icefyre Semiconductor Corporation (CA)

( * ) Notice: Subject to any disclaimer, the term of this patent is extended or adjusted under 35 U.S.C. 154(b) by 0 days.

(21) Appl. No.: 10/610,145

(22) Filed: Jun. 30, 2003

(65) Prior Publication Data

US 2004/0027199 A1 Feb. 12, 2004

Related U.S. Application Data

(63) Continuation-in-part of application No. 10/004,703, filed on Dec. 3, 2001, now Pat. No. 6,603,352.

(51) Int. Cl.[7] .............................................. H03F 3/127
(52) U.S. Cl. ................................... 330/251; 330/207 A
(58) Field of Search ........................ 330/124 R, 207 A, 330/251

(56) References Cited

U.S. PATENT DOCUMENTS

| | | | | |
|---|---|---|---|---|
| 3,854,100 A | * | 12/1974 | Pouzadoux | 330/251 |
| 5,612,647 A | | 3/1997 | Malec | 330/146 |
| 5,930,128 A | | 7/1999 | Dent | 363/43 |
| 6,285,251 B1 | * | 9/2001 | Dent et al. | 330/124 R |
| 6,300,829 B1 | | 10/2001 | Luu | 330/251 |
| 6,304,137 B1 | * | 10/2001 | Pullen et al. | 330/251 |
| 6,323,733 B1 | | 11/2001 | Gorcea et al. | 330/297 |

OTHER PUBLICATIONS

PCT International Search Report for International Application No. PCT/CA02/01847.

* cited by examiner

Primary Examiner—Khanh V. Nguyen
(74) Attorney, Agent, or Firm—Kirkpatrick & Lockhart Nicholson Graham LLP

(57) ABSTRACT

A switched-mode power amplifier is configured for performing power amplification of a plurality of signals input thereto and integrally summing (combining) those signals. Conceptually, this is achieved by replacing the input winding of the transformer component of a transformer-coupled voltage switching amplifier with separate input components, one for each input signal, in similar manner to the configuration of the input components of a three-port combiner (trifilar). In a first transformer-containing category of embodiments of the invention, the input winding of the amplifier's transformer is comprised of a plurality of series-coupled windings, one for each of the plurality of input components/signals such that the input components constitute a series connection of low output impedance sources applied to the amplifier's resonator and load. This, in turn, provides a high level of isolation between the amplifier input components and results in a low level of loss. In a second non-transformer-containing category of embodiments of the invention, the transformer component is replaced by a transmission line impedance transformer, or a lumped element equivalent circuit, which transforms the low output impedance sources to high output impedance sources and those sources are connected in parallel (rather than in series per the first category of embodiments).

11 Claims, 9 Drawing Sheets

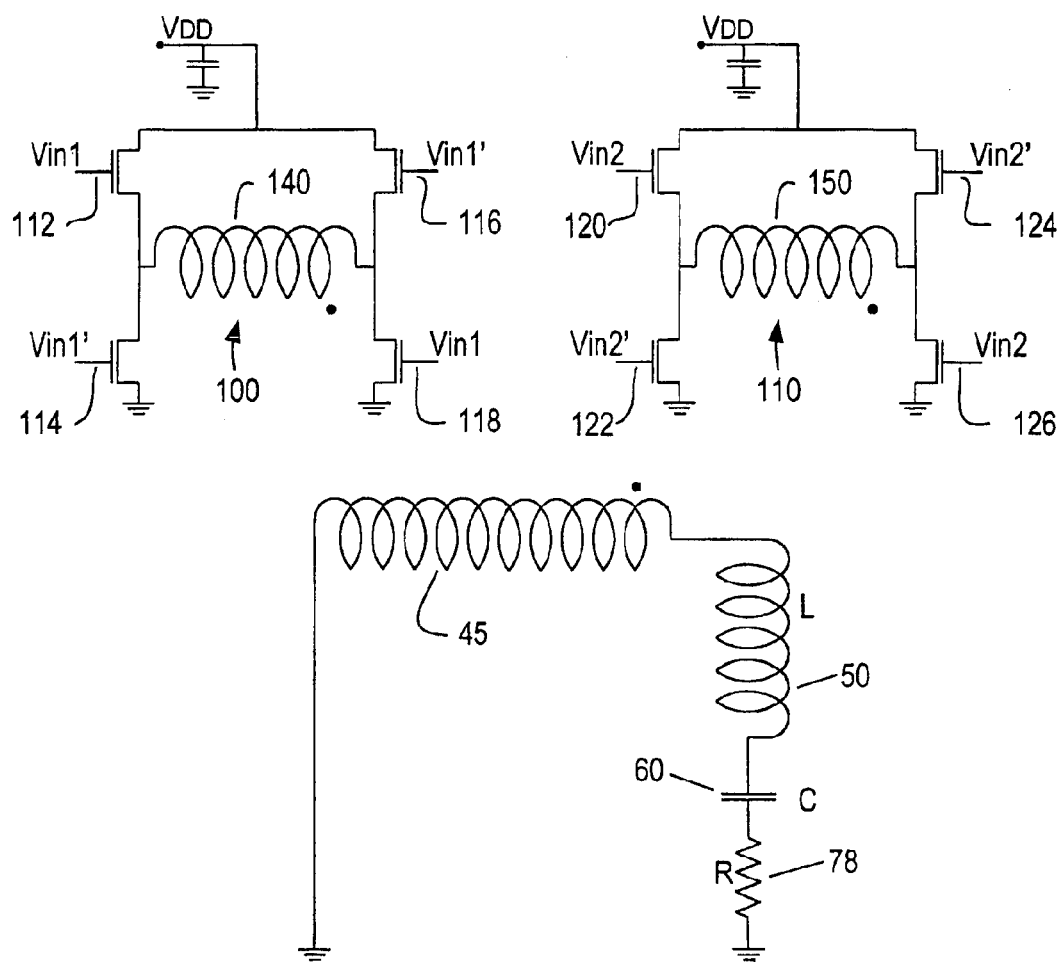
FIG. 3A (ii)

SWITCHED-MODE POWER AMPLIFIER INTEGRALLY PERFORMING POWER COMBINING

RELATED APPLICATION

This application is a continuation-in-part application of application Ser. No. 10/004,703 filed on 3 Dec. 2001 now U.S. Pat. No. 6,603,352.

FIELD OF THE INVENTION

The invention relates to circuitry for radio frequency (i.e. "RF" or "wireless") transmitters and in particular to power amplifier circuitry providing signal combining integral to the power amplification.

BACKGROUND OF THE INVENTION

Typically, power combiners are used in RF transmitters to combine the output signals of parallel power amplifiers into one high power RF output signal for wireless transmission. In these known transmitter structures the signals are first amplified by the power amplifiers and then they are combined by a power combiner to produce a combined amplified signal for transmission. Depending upon the circuit architecture and signal format used, however, it becomes necessary to make trade-offs between reducing power losses and achieving isolation between input signals of the combiner.

The need for efficiency is a particularly important design factor for the highly integrated requirements of transceivers used for wireless local area networks (LANs) and employing modulation formats such as OFDM (Orthogonal Frequency Division Multiplex). Moreover, the assignee of this invention and application has developed signal modulation methods, using OFDM signal format, whereby information signals are deconstructed into independent component signals, these independent signals being more efficiently processed and modulated than the original information signals from which they derive, and then the independent signals are up-converted, amplified and combined prior to transmission. Use of such independent modulated signals presents additional challenges to achieving efficiency at the amplification/combination stages of the transmitter, however, because the conventional model of amplification followed by combining, using known power amplifiers and combiners, is subject to inherent loss and isolation limitations.

Non-reciprocal combiners are considered to be non-economic for applications such as low cost wireless. Instead, reciprocal combiners, realized as either four-port or three-port structures, are available for use in such applications. Four-port combiners provide an advantage of isolation between the individual inputs (which means that the output impedances of the amplifier stages do not load each other) but where the signals being amplified are non-identical (i.e. statistically independent) an inherent loss of 3 dB results (this loss disappears where the signals are identical due to resonance). Thus, four-port combiners are generally only suitable for use where the signals being amplified are identical.

A three-port combiner, also known as a trifilar, is able to provide a degree of isolation between its individual inputs, depending upon the output impedance of the amplifiers feeding it and the load impedance connected to the combiner's output. If the output impedances of the individual amplifiers and the output loading impedance of the combiner are the same, then isolation is not achieved and an inherent loss of 3 dB results. On the other hand, if the output impedances of the amplifiers are small in comparison with the output loading impedance of the combiner, then the inherent loss diminishes, and approaches 0 dB for 0 ohms output impedance.

The many classes of power amplifiers can be broadly sorted into two classifications; linear and switched-mode. Linear amplifiers provide an output-impedance resulting from the bias condition and load line for the active device (in the usual case, the active device being a transistor). In practice, this output impedance is typically in the range of 5 to 50 ohms. As a result, limited isolation is achievable when using a three-port combiner (trifilars) to combine the outputs of two linear amplifiers. As known by persons skilled in the art, a conventional class D, E or F switched-mode power amplifier consists of an input component having at least one active (switching) device, a central transformer component and an output component consisting of a resonator. It is impractical to apply the output signals of separate switched-mode amplifiers to a trifilar, to combine them, because of the cost and space requirements (and resulting inefficiency) associated with the multiple transformer windings required for such a design.

By reason of the foregoing limitations of known RF components, there exists a need for new and efficient means to achieve power amplification and combining of modulated signals in transmitters.

SUMMARY OF THE INVENTION

As disclosed in the parent application Ser. No. 10/004,703, a switched-mode power amplifier is configured for performing power amplification of a plurality of analog, phase-modulated signals input thereto and integrally combining those signals. Conceptually, this is achieved by replacing the input winding component(s) of the transformer within a conventional transformer-coupled voltage switching amplifier with separate input winding components, one for each input signal, in similar manner to the configuration of the input components of a conventional three-port combiner (trifilar). Accordingly, the input winding of the amplifier's transformer is comprised of a plurality of separate, series-coupled input component windings.

The inventors have found that the foregoing series-coupled input component windings, representing voltage sources of low output impedance, and output winding, can be replaced by a suitable impedance inverter so as that instead of representing low output impedance voltage sources they represent high output impedance current sources. Accordingly, in accordance with the present invention there is provided an alternative, parallel-coupled, switched-mode power amplifier configured for integrally amplifying and combining a plurality of signals (e.g. analog phase modulated signals) input thereto. The amplifier comprises an input component for each of the plurality of input signals. Each input component comprises at least one active device configured to be alternately switched by the input signal and to present an amplified signal corresponding to the input signal, such that each input component constitutes a low output impedance voltage source. An output resonator component connects to a load and an impedance inverter is provided between each input component and the resonator component. The impedance inverter is configured for transforming the low output impedance voltage source to a high output impedance current source so that the high output impedance sources produced by the input components can be combined in parallel, to produce a summation signal, before being passed to the resonator component.

The amplifier may be class D, E or F and may be a balanced or unbalanced-type amplifier. The impedance inverter may be a quarter-wavelength transmission line or a lumped element equivalent component, for example, comprising a series inductor and two shunt-to-ground, negative inductors of equal absolute value connected to each terminal end of the series inductance. In a semiconductor product implementation of the amplifier it is advantageous to incorporate the negative inductors into other reactive components of the amplifier. Moreover, in such implementation the series inductor may be provided by a spiral inductor as known in the art. However, as disclosed in a co-pending application assigned to the same assignee as this application, entitled "Integrated Circuit Incorporating Wire Bond Inductance" and filed on the same date as this continuation-in-part application, the content of which is incorporated herein by reference, the series inductor may instead be provided by means of a wire-bond (which takes advantage of an inherent, but heretofore undesirable property of wire-bonds).

In accordance with a further aspect of the invention there is provided a method for integrally amplifying and combining a plurality of input signals to produce a single amplified, summation signal for input to a resonator component. Each input signal is amplified by a separate amplifier input component to produce an amplified signal corresponding to the input signal and constituting a low output impedance voltage source. To perform the amplifying the input signal is applied to at least one active device of the input component to cause alternate switching of the active device. Each low output impedance voltage source is transformed to a high output impedance current source and the high output impedance sources are combined, in parallel, to produce the single amplified, summation signal.

The transforming is performed by a quarter-wavelength transmission line impedance inverter or lumped element equivalent component, for example, a series inductor and two shunt-to-ground, negative inductors of equal absolute value connected to each terminal end of the series inductance. Preferably, the negative inductors of the lumped element equivalent component are incorporated into other reactive components and the series inductor of the lumped element equivalent component is provided by means of a spiral inductor or wire-bond in a semiconductor product configured to implement this method.

BRIEF DESCRIPTION OF THE DRAWINGS

Exemplary preferred embodiments of the invention, and variants thereof, are described in detail below with reference to the following drawings in which like references refer to like elements throughout:

FIG. 3A(i) illustrates a balanced switched-mode power amplifier for performing integral combining in accordance with the invention, wherein one half of the center-tapped winding of each input component of the amplifier is used for each half cycle of the signal input thereto (Vin1 and Vin2);

FIG. 3A(ii) illustrates a variant configuration of a balanced switched-mode power amplifier which differs from the design shown by FIG. 3A(i) in that the full winding of each input component of the amplifier is used for each half cycle of the signal input thereto (Vin1 and Vin2) i.e. instead of the center-tapped (i.e. half) windings of the embodiment shown by FIG. 3A(i);

DETAILED DESCRIPTION OF ILLUSTRATED EMBODIMENTS

Surprisingly, the inventor(s) invented and developed a means for achieving improved power amplification and power combining which provides greater efficiency over the known, successively staged power amplifier and combiner designs. Advantageously, the switched-mode amplifier of the present invention integrally performs power amplification and combining of signals input thereto. According to the invention multiple input signals are combined (summed) inside the power amplifier after they are amplified and before they are applied to the resonator component of the amplifier, and hence to a load impedance. This contrasts markedly with the known power amplifiers for which power combining takes place following the complete amplification process. A known (prior art) switched-mode power amplifier is illustrated by FIG. 1 and a known (prior art) three-port power combiner (trifilar) is illustrated by FIG. 2, the configuration, manner of operation, and operating parameters and characteristics of both of these devices being well understood by persons skilled in the art.

Figure 1:
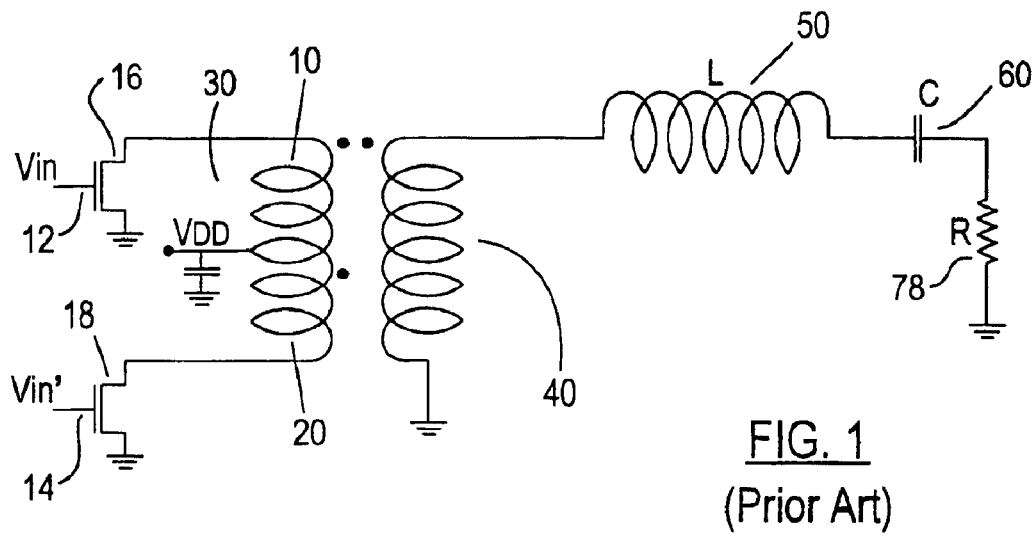
FIG. 1 illustrates a prior art balanced, transformer coupled, switched-mode power amplifier (class D) having a voltage switching architecture, as well known to persons skilled in the art.
Figure 2:
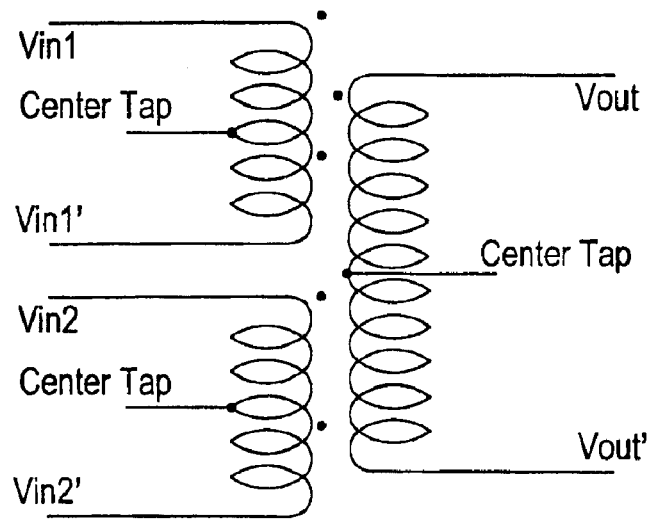
FIG. 2 illustrates a prior art three-port power combiner (also referred to as a "trifilar"), as well known to person skilled in the art.

The prior art switched-mode power amplifier shown by FIG. 1 has a transformer-coupled voltage switching architecture and comprises a balanced center-tapped input winding 30 made up of input winding components 10, 20 and an output winding 40 which, together, make up a transformer component of the amplifier. The manner of operation of this amplifier is well known by persons skilled in the art. In operation, the outputs of the active devices (transistors) 16, 18 function as a teeter-totter switch, switching between the two input peak levels of the signals Vin and Vin' 12, 14, where Vin' is the inverse of Vin (Vin being a constant envelope phase modulated signal). The resulting signals produced by each input winding component 10 and 20 track the phase changes of the input signal Vin and alternately switch between a voltage rail $V_{DD}$ and ground. Therefore, the signals at winding components 10 and 20 are two complementary square wave voltage signals which are combined by the input winding 30 to produce an amplified signal corresponding to the input signal Vin. The half windings are balanced and have a high coupling coefficient between them, for purposes of efficiency. The amplified summation signal which results across the output winding 40 of the transformer component is connected in series to a tuned output resonator (filter) component, comprising an inductor (L) 50 and capacitor (C) 60, for output to a load impedance (R) 78.

The active devices 16 and 18 of the foregoing switched-mode amplifier never experience, simultaneously, a voltage across them and a current through them. Consequently, they present an output impedance that alternates between an open circuit and a short circuit. The output impedance for each individual active device is complementary to that of the other active device in that when one is an open circuit, the other is a short circuit. When an open circuit is presented to one component, 10 or 20, of the input winding 30 it does not load the transformer (since no current will flow through that particular input winding component 10 or 20) and the resulting composite impedance presented to the transformer is that of the short circuit (zero ohms) from the complementary input winding component 20 or 10, respectively. Note that this exemplary switched-mode amplifier uses voltage switching. An alternative to voltage switching is to use current switching which switches between a current source and an open circuit. However, in practice such alternative may be less desirable due to the need to provide a constant current source.

The inventor(s) discovered that this very low (theoretically zero) output impedance presented by the active devices 16, 18 of a switched-mode amplifier can be used advantageously to achieve a superposition i.e. combining of signal voltages. Specifically, the inventor(s) made a surprising discovery that such a superposition of voltage signals is achieved by replacing the center-tapped transformer of this switched-mode power amplifier with separate input stages in similar manner to a three-port combiner (trifilar).

Figure 3A:
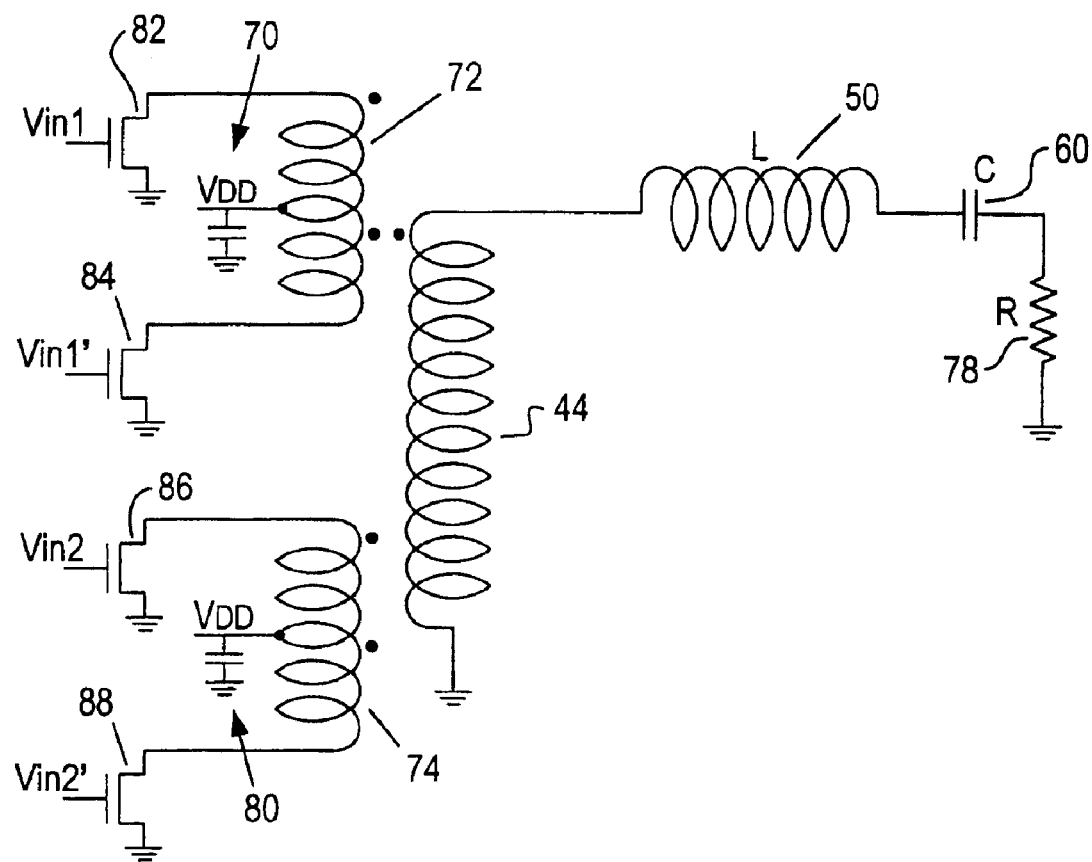
FIGS. 3A(i), 3A(ii) and 3B illustrate switched-mode power amplifiers configured in accordance with the present invention for performing integral combining and amplification of the input signals (shown here as the two input signals Vin1 and Vin2)

An illustration of one embodiment of the invention is provided by FIG. 3A(i) from which it can be seen that the input winding 30 (consisting of winding halves 10 and 20) of the transformer of the prior art amplifier illustrated by FIG. 1 has been replaced, in this switched-mode amplifier, by input windings 72 and 74 of separate input components 70 and 80, one for each of two input voltage signals Vin1 and Vin2 which are to be amplified and combined, wherein the input components 70, 80 comprise active devices 82 and 84, and 86 and 88, resp., and the input windings 72 and 74, resp. As such, each input component 70, 80 functions in similar manner to one trifilar input.

As shown by FIG. 3A(i), the signals Vin1, Vin1' and Vin2, Vin2' are fed to the active devices 82, 84 and 86, 88, respectively (whereby Vin1' is the inverse of Vin1 and Vin2' is the inverse of Vin2). Windings 72 and 74 see only the very low impedance (theoretically zero) of the active device which drives them (i.e. the active device which is switched on and presents a short circuit). The two input component windings 72 and 74 are coupled in series and, by superposition, the current waveforms generated within these windings by the two input voltage signals Vin1 and Vin2 are caused to superimpose and result in a summation of the two signals within the output winding 44 which is connected at one terminal end to ground and at the other terminal end to a resonator component 50, 60. This summation occurs within the amplifier before the amplified, summed signal is fed to the resonator component 50, 60 and hence to a load impedance 78. As such, a single amplifier resonator is shared between the two switched-mode amplifier input signals Vin1 and Vin2. Alternatively, in a different (optional) embodiment (not shown) both terminal ends of the output winding 44 may be connected to a resonator component in a balanced manner (instead of one terminal end being connected to ground as illustrated in FIG. 3A(i)).

The integrally combining amplifier of FIGS. 3A(i) and 3A(ii) achieves such combining of non-identical (independent) input signals Vin1 and Vin2 with low (theoretically zero) loss. It is to be understood that, although this illustrated embodiment uses only two input signals (Vin1 and Vin2, being analog, constant envelope phase modulated signals) a larger number of input signals (i.e. Vin1, Vin2, Vin3, . . . ) may be amplified in similar manner in accordance with the invention.

FIG. 3A(ii) illustrates a variant circuit design to that shown by FIG. 3A(i) wherein a bridge architecture is used for the amplifier input components 100 and 110 rather than the balanced architecture of the embodiment of FIG. 3A(i). In this embodiment the full input component winding 140, 150 of each input component 100 and 110, respectively, is used for each switched cycle of the signal input thereto (Vin1 and Vin2). This differs from the balanced architecture of the embodiment of FIG. 3A(i) in which half windings, only, are energized at any given time and, thus, the half windings must be highly coupled. As shown, for each input component 100 and 110 bridge-configured (i.e. cross-located) pairs of active devices (transistors) 112 and 118, 114 and 116 and 120 and 126, 122 and 124, respectively, are alternately switched between an open circuit and a short circuit. As a result, the direction of current flow through each of the windings 140, 150 is alternately switched every half cycle of the signal and the full winding is used each time. Therefore, this embodiment avoids the need to ensure highly coupled half windings associated with the embodiment of FIG. 3A(i).

Figure 3B:
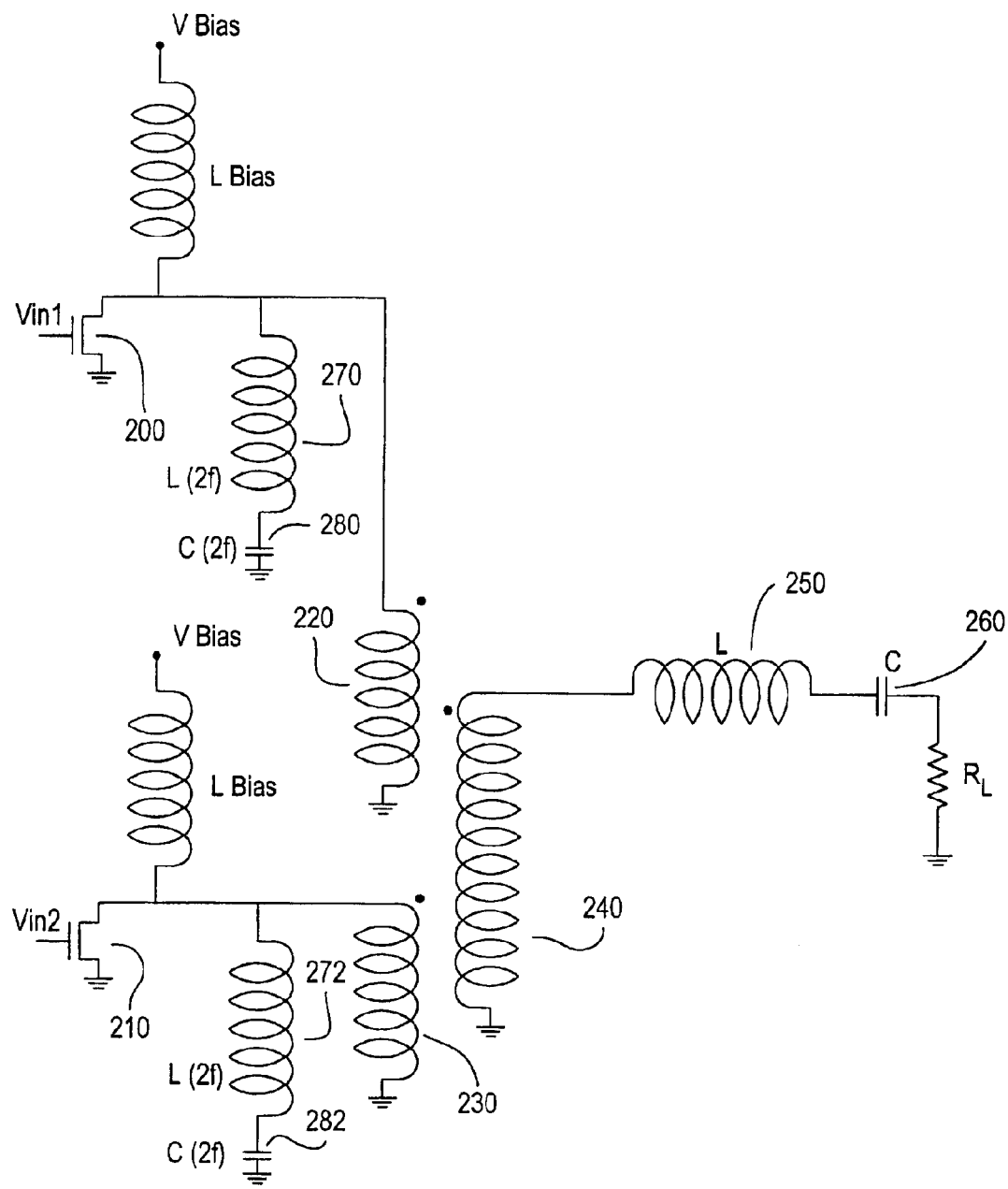
FIG. 3B illustrates an unbalanced class F switched-mode power amplifier configured for performing integral combining of the signals input thereto (Vin1 and Vin2) (but, as will be noted by a person skilled in the art, this circuit omits the use of a parallel resonant circuit, in series before the load, tuned to the third harmonic, to support the third harmonic voltages)

FIG. 3B illustrates a further embodiment of an amplifier circuit design configured according to the present invention to perform integral combining. This figure illustrates an unbalanced class F amplifier architecture but omits use of a parallel resonant circuit tuned to the third harmonic, to support the third harmonic voltages, as is commonly included in series before the load (such omission having a relatively minor effect on the overall performance/efficiency of an actual, practical amplifier circuit since the third harmonic signals are of much lesser significance than the fundamental or second harmonic signals). The configuration, operating parameters and characteristics of this amplifier architecture are well-known by persons skilled in the art.

A Class F amplifier is designed to provide a good approximation to a voltage square-wave across the output terminals of the active device. In theory it does so by "shorting" all even-harmonic voltages and "supporting" all odd-harmonic voltages, but in practice it is typical to process only the second harmonic voltage, or only the second and third harmonic voltages, accordingly. As a result, the voltage waveform across the output terminals of the active device contains only odd-harmonic components. In addition, this sorting of odd- and even-harmonics, which may be conveniently achieved (up to the third harmonic) with a series resonant circuit (at the second harmonic) connected across the active device's output terminals, and a parallel resonant circuit (at the third harmonic) connected between the active device's output terminal and the load, results in a current passing through the output terminals of the active device that contains the fundamental, and only even-harmonic components. The series resonator (consisting of L(2f) 270 and C(2f) 280 for the Vin1 signal input component and L(2f) 272 and C(2f) 282 for the Vin2 signal input component in the circuit of FIG. 3B) will short the second harmonic signal and support the third harmonic signal, while the parallel resonator will block the third harmonic signal from the load. Since each harmonic contains only a voltage component or a current component, the active device will not absorb power, except at the fundamental frequency. A problem associated with the Class F architecture, however, is the existence of a source-drain (emitter-collector) parasitic capacitance which detunes the resonances which, in practice, allows some amplitude of all harmonics of the voltage and current to exist.

As shown by FIG. 3B, the separate input signals Vin1 and Vin2 are input to active devices 200 and 210 which switch between the voltage rail ($V_{DD}$) and ground depending on the input signal value. As for the previous embodiments, the input signals are thereby amplified and combined, by means of coupled input windings 220 and 230 and the output winding 240, before being passed to a resonator component 250, 260 designed to pass the current of the fundamental frequency to the load.

Surprisingly, the inventor(s) found that the functionality of the input and output windings (i.e. the transformer component) of the foregoing amplifier circuit designs may be achieved, in equivalent manner, through the use of various equivalent (alternative) components located either directly within the circuit itself or indirectly external to the circuit but electronically within it, as detailed hereinafter. Advantageously, these equivalent components do not use a magnetic transformer and, thus, avoid the inherent significant loss which results from a magnetic transformer due the limited Q that can be achieved for coils on a semiconductor substrate.

Figure 4:
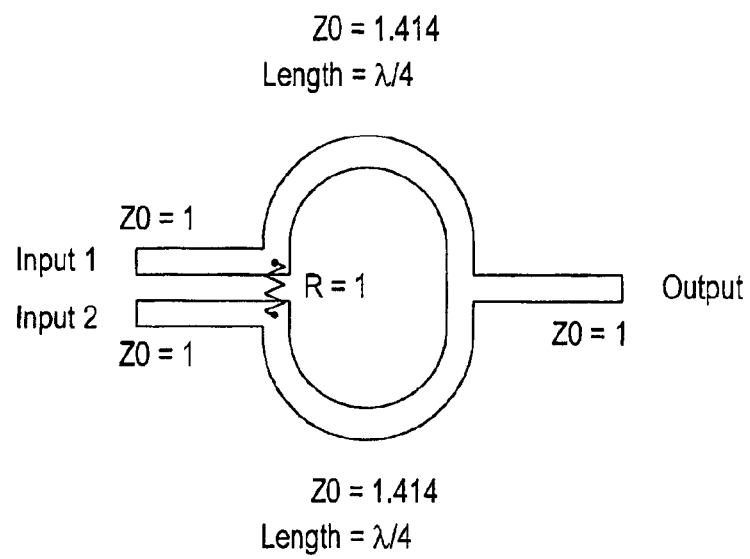
FIG. 4 illustrates the well-known, prior art Wilkinson combiner circuit configuration which provides a transmission line equivalent to the trifilar, with an isolating resister between the separate inputs, wherein the separate inputs are combined in series by means of the impedance inversion operation of a quarter-wavelength ($\lambda/4$) transmission line, as shown.

In making this finding, the inventor(s) initially contemplated the well-known Wilkinson combiner circuit configuration shown by FIG. 4, which provides a transmission line equivalent to the trifilar. As shown in FIG. 4, an isolating resister (R) is provided between separate inputs (Input 1 and Input 2) and these inputs are combined in series by means of an impedance inversion operation resulting from the use of a quarter-wavelength ($\lambda/4$) transmission line i.e. a transmission line whose length is equal to one quarter of the wavelength of the input signals. This is also referred to as an impedance inverter which functions to transform a low output impedance to a high output impedance. As is known by persons skilled in the art (and shown by FIG. 4), the characteristic impedance of such a transmission line is 1.414 (i.e. $2^{1/2}$) times the impedance of the input components (Input 1 and Input 2) to achieve matching to the output impedance.

Figure 5:
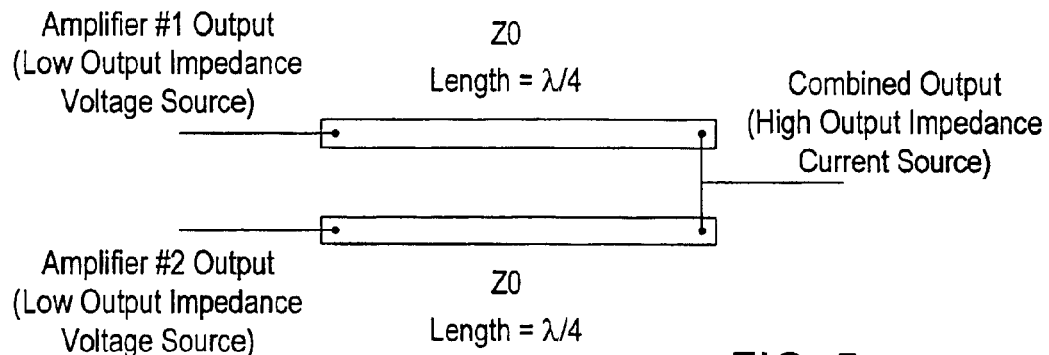
FIG. 5 illustrates a transmission line equivalent to the trifilar configured for incorporation into a switched-mode amplifier to achieve integral combining in accordance with the invention.
Figure 6:
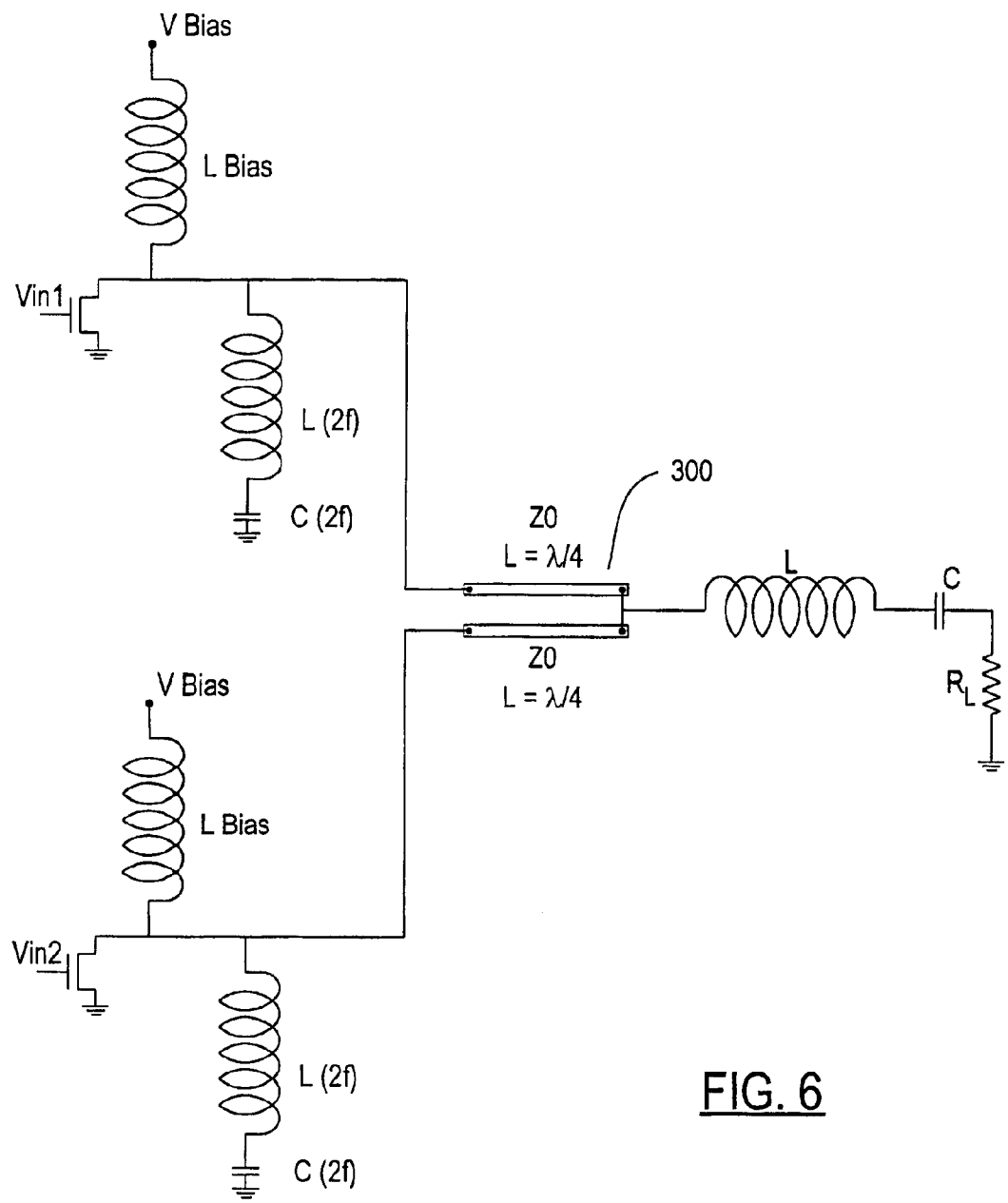
FIG. 6 illustrates a variant configuration of the unbalanced switched-mode power amplifier of FIG. 3B, for performing integral combining of the signals input thereto (Vin1 and Vin2) using a transmission line equivalent to the trifilar, per that FIG. 5, instead of the trifilar shown in FIG. 3B.

FIG. 5 schematically illustrates a transmission line equivalent to the trifilar for incorporation into an unbalanced switched-mode amplifier to perform integral combining of the signals input thereto (Vin1 and Vin2). FIG. 6 illustrates an unbalanced switched-mode amplifier in which a quarter-wavelength ($\lambda/4$) transmission line 300 is used accordingly.

Figure 7A:
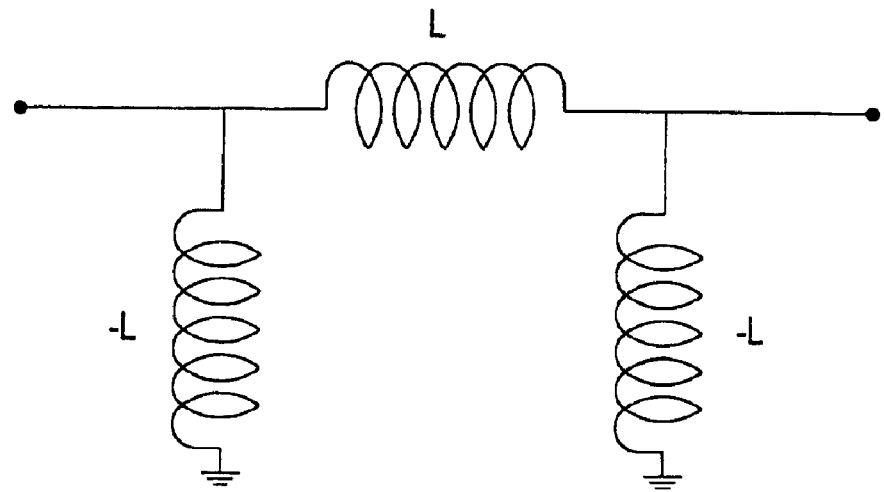
FIGS. 7A, 7B, 7C and 7D illustrate four different, alternative lumped element circuit equivalents to quarter-wavelength transmission lines and, therefore, these also provide circuit equivalents for the trifilar; and, FIG. 8 illustrates a further variant configuration of the unbalanced switched-mode power amplifier of FIG. 3B, for performing integral combining of the signals input thereto (Vin1 and Vin2) using a lumped element equivalent to the trifilar, per that FIG. 7A, instead of the trifilar shown in FIG. 3B.
Figure 7B:
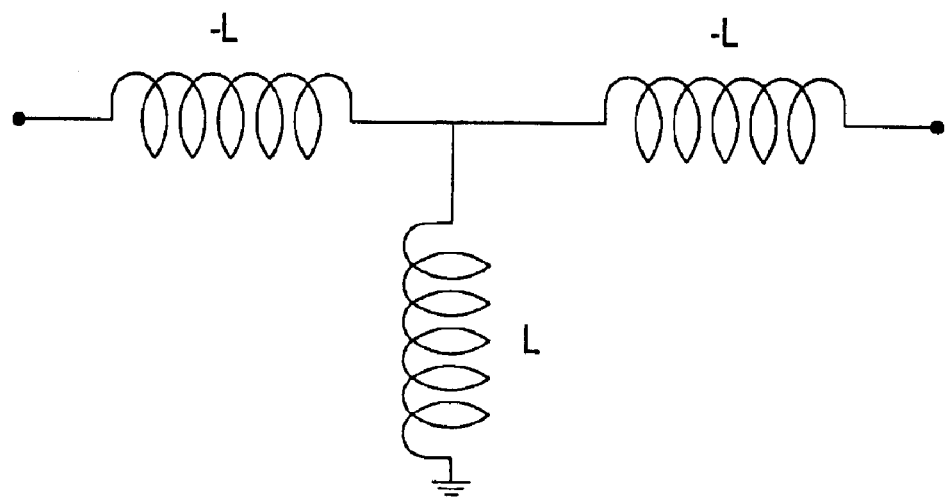
Figure 7C:
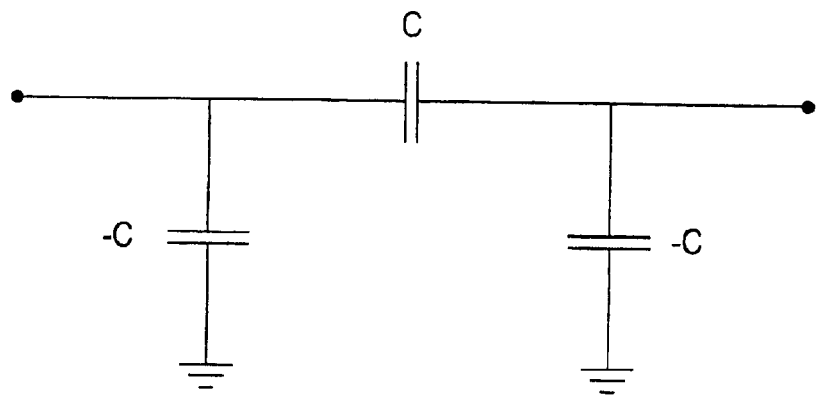
Figure 7D:
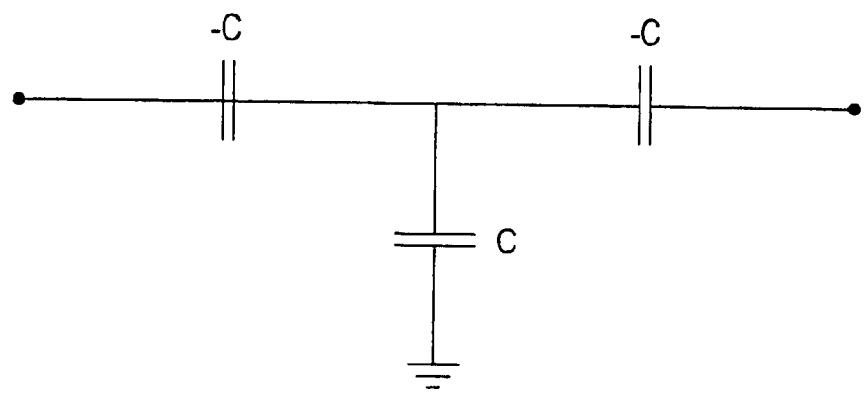

Next, it was contemplated by the inventor(s) that the impedance inverter function provided by the foregoing transmission line equivalent, is also provided by the lumped element equivalent circuit shown by FIG. 7A consisting of a series inductance and two shunt-to-ground, negative inductances of equal absolute value connected to each terminal end thereof. Similarly, the lumped element equivalents shown by FIGS. 7B, 7C and 7D provide the same impedance inverter function (since, over a limited bandwidth, a positive capacitor will function equivalently to a negative inductor).

Figure 8:
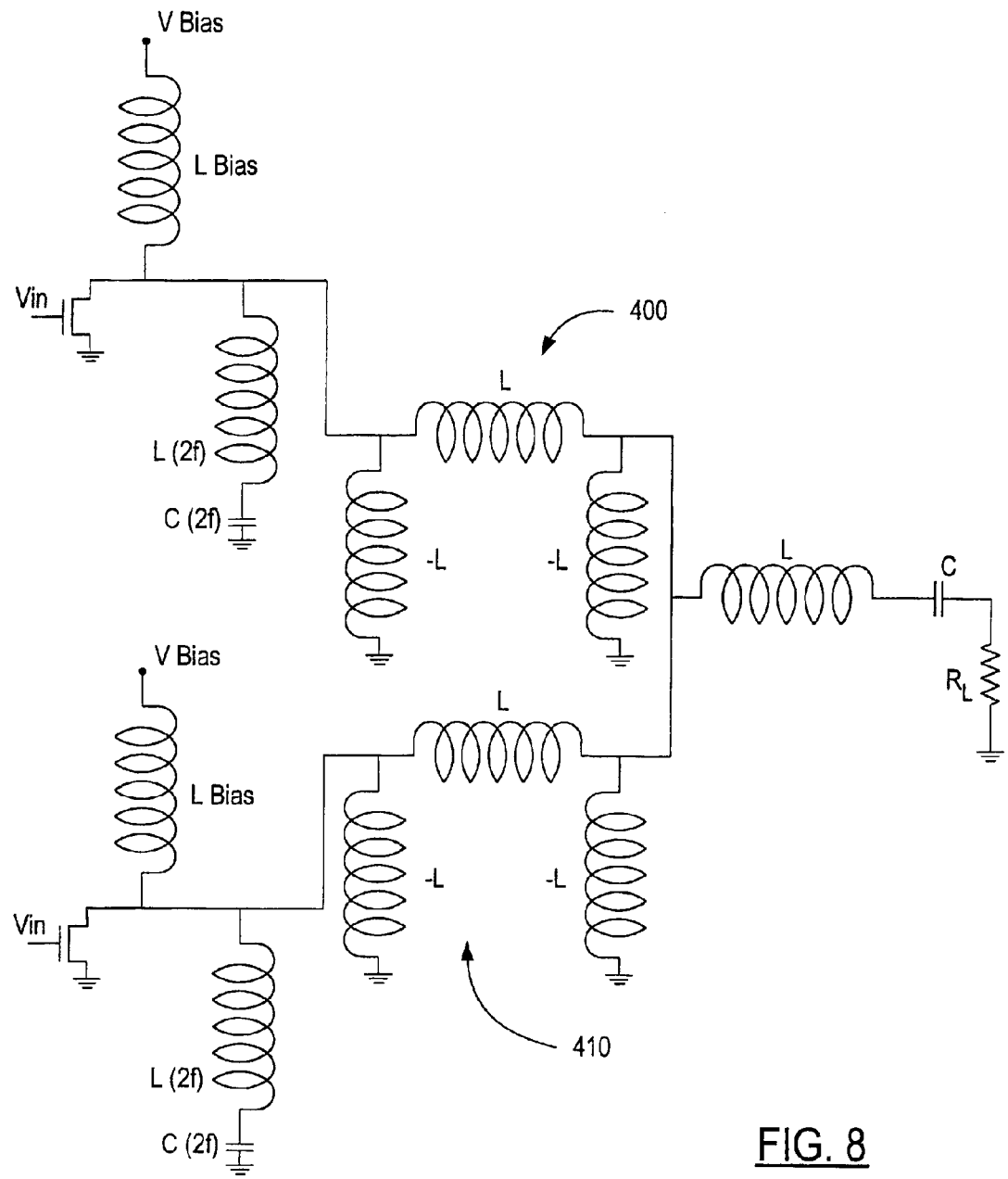

FIG. 8 illustrates an embodiment of the invention which uses, for integral combining, lumped element equivalent components (impedance inverters) 400, 410, according to that shown by FIG. 7A, in place of the trifilar-type transformer component of the foregoing unbalanced switched-mode power amplifier shown in FIG. 3B. It has been found, advantageously, that the negative inductances may be realized by incorporating their values into other existing reactive circuit elements surrounding the active device such as adjacent harmonic traps, RF chokes and the output resonator. Alternatively, they may be realized over a limited bandwidth with the use of a positive capacitor (and, similarly, a negative capacitor may be realized with the use of a positive inductor).

For the particular amplifier circuit design shown in FIG. 8, the left-most negative inductance of the impedance inverter is realized by incorporating its value into the second harmonic resonator (trap) or bias inductor and the right-most negative inductance is taken into account by appropriate changes in the values of the inductor and capacitor of the following resonator circuit. Moreover, it has been determined by the assignee of this invention that the positive inductance of the impedance inverter can be realized as a wire-bond in the semiconductor product implementation of the circuit, whereby the actual combining takes place off die, at the package pin. The means and method of performing such a wire-bond realization is described in detail in a co-pending application assigned to the same assignee as this application, entitled "Integrated Circuit Incorporating Wire Bond Inductance" and filed on the same date as this continuation-in-part application, which is incorporated herein by reference.

The individual electronic and processing functions utilised in the foregoing described embodiment are, individually, well understood by those skilled in the art. It is to be understood by the reader that a variety of other implementations may be devised by skilled persons for substitution. Moreover, it will be readily understood by persons skilled in the art that a coil (inductor) component such as item 44 shown in FIG. 3A(i) can be provided by an equivalent plurality of smaller series-connected coils (i.e. rather than a unitary coil). The claimed invention herein is intended to encompass all such alternative implementations, substitutions and equivalents. Persons skilled in the field of electronic and communication design will be readily able to apply the present invention to an appropriate implementation for a given application.

Consequently, it is to be understood that the particular embodiments shown and described herein by way of illustration are not intended to limit the scope of the invention claimed by the inventors/assignee which is defined by the appended claims.

What is claimed is:

1. A switched-mode power amplifier configured for integrally amplifying and combining a plurality of analog phase modulated signals input thereto, said amplifier comprising:
   (a) an input component for each of said plurality of analog phase modulated input signals wherein each said input component comprises at least one active device configured to be alternately switched by-said by an analog phase modulated input signal to present an amplified signal corresponding to said analog phase modulated input signal, said amplified signal constituting a low output impedance voltage source;
   (b) an output resonator component; and,
   (c) an impedance inverter between each said input component and said resonator component, said impedance inverter configured for transforming said low output impedance voltage source to a high output impedance current source, wherein said high output impedance sources are combined in parallel before being passed to said resonator component;
   wherein said impedance inverter comprises a lumped element equivalent component to a quarter-wavelength transmission line:
   wherein said lumped element equivalent component comprises two or more of a series inductor, a series negative inductor, a shunt-to-ground inductor, a shunt-to-ground negative inductor, a series capacitor, a series negative capacitor, a shunt-to-ground capacitor, and a shunt-to-ground negative capacitor.

2. A switched-mode power amplifier according claim 1, wherein said lumped element equivalent component comprises a series inductor and two shunt-to-ground, negative inductors connected to each terminal end of said series inductor, said inductors being of equal absolute value.

3. A switched-mode power amplifier according to claim 1, wherein said lumped element equivalent component comprises two series negative inductors and a shunt-to-ground inductor between said series inductor, said inductors being of equal absolute value.

4. A switched-mode power amplifier according to claim 1, wherein said lumped element equivalent component comprises a series capacitor and two shunt-to-ground, negative capacitors connected to each terminal end of said series capacitor, said capacitors being of equal absolute value.

5. A switched-mode power amplifier according to claim 1, wherein said lumped element equivalent component comprises two series negative capacitors and a shunt-to-ground capacitor between said series capacitor, said capacitors being of equal absolute value.

6. A method for integrally amplifying and combining a plurality of analog phase modulated input signals to produce a single amplified, summation signal for input to a resonator component, said method comprising:
   a. amplifying each said analog phase modulated input signal by a separate amplifier input component to produce an amplified signal corresponding to an analog phase modulated input signal and constituting a low output impedance voltage source, said amplifying comprising applying said analog phase modulated input signal to at least one active device of said input component to cause alternate switching of said active device; and,
   b. transforming each said low output impedance voltage source to a high output impedance current source; and,
   c. combining said high output impedance sources in parallel to produce a single amplified, summation signal;
   wherein said transforming is performed by an impedance inverter comprising a lumped element equivalent component to a quarter-wavelength transmission line; and
   wherein said lumped element equivalent component comprises two or more of a series inductor, a series negative inductor, a shunt-to-ground inductor, a shunt-to-around negative inductor, a series capacitor, a series negative capacitor, a shunt-to-ground capacitor, and a shunt-to-around negative capacitor.

7. A method according to claim 6, whereby said lumped element equivalent component comprises a series inductor and two shunt-to-ground, negative inductors of equal absolute value connected to each terminal end of said series inductance.

8. A method according to claim 6, whereby said lumped element equivalent component comprises two series negative inductors and a shunt-to-ground inductor between said series inductor, said inductors being of equal absolute value.

9. A method according to claim 6, whereby said lumped element equivalent component comprises a series capacitor and two shunt-to-ground, negative capacitors connected to each terminal end of said series capacitor, said capacitors being of equal absolute value.

10. A method according to claim 6, whereby said lumped element equivalent component comprises two series negative capacitors and a shunt-to-ground capacitor between said series capacitor, said capacitors being of equal absolute value.

11. A switched-mode power amplifier configured for integrally amplifying and combining a plurality of signals input thereto, said amplifier comprising:
   (a) an input component for each of said plurality of input signals wherein each said input component comprises at least one active device configured to be alternately switched by said input signal to present an amplified signal corresponding to said input signal, said amplified signal constituting a low output impedance voltage source;
   (d) an output resonator component; and,
   (e) an impedance inverter between each said input component and said resonator component, said impedance inverter configured for transforming said low output impedance voltage source to a high output impedance current source, wherein said high output impedance sources are combined in parallel before being passed to said resonator component;
   wherein said impedance inverter comprises at least one of:
      (i) a series inductor and two shunt-to-ground, negative inductors connected to each terminal end of said series inductor, said inductors being of equal absolute value;
      (iii) two series negative inductors and a shunt-to-ground inductor between said series inductor, said inductors being of equal absolute value;
      (ii) a series capacitor and two shunt-to-ground, negative capacitors connected to each terminal end of said series capacitor, said capacitors being of equal absolute value; and
      (iv) two series negative capacitors and a shunt-to-ground capacitor between said series capacitor, said capacitors being of equal absolute value.

* * * * *

UNITED STATES PATENT AND TRADEMARK OFFICE
CERTIFICATE OF CORRECTION

PATENT NO. : 6,937,096 B2
DATED : August 30, 2005
INVENTOR(S) : Wight et al.

It is certified that error appears in the above-identified patent and that said Letters Patent is hereby corrected as shown below:

Column 9,
Line 8, delete "by-said".

Signed and Sealed this

Twenty-fifth Day of October, 2005

JON W. DUDAS
*Director of the United States Patent and Trademark Office*